(12) United States Patent
Beach et al.

(10) Patent No.: US 7,630,177 B2
(45) Date of Patent: Dec. 8, 2009

(54) TUNNEL MR HEAD WITH CLOSED-EDGE LAMINATED FREE LAYER

(75) Inventors: Robert Stanley Beach, Los Gatos, CA (US); David Eugene Heim, Redwood City, CA (US); Vladimir Nikitin, Campbell, CA (US); David John Seagle, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 429 days.

(21) Appl. No.: 11/355,045

(22) Filed: Feb. 14, 2006

(65) Prior Publication Data

US 2007/0188942 A1 Aug. 16, 2007

(51) Int. Cl.
G11B 5/39 (2006.01)
(52) U.S. Cl. .................. 360/324.2; 360/324.12
(58) Field of Classification Search ............. 360/324.2, 360/324.12, 324.11
See application file for complete search history.

(56) References Cited

U.S. PATENT DOCUMENTS

| 5,032,945 | A | 7/1991 | Argyle et al. ............. 360/126 |
| 5,483,403 | A | 1/1996 | Voegeli .................... 360/113 |
| 5,587,943 | A | 12/1996 | Torok et al. .............. 365/158 |
| 5,696,654 | A | 12/1997 | Gill et al. ................ 360/113 |
| 5,905,611 | A | 5/1999 | Yoda et al. ............... 360/113 |
| 6,166,948 | A | 12/2000 | Parkin et al. ............. 365/173 |
| 6,358,757 | B2 | 3/2002 | Anthony ..................... 438/3 |
| 6,455,177 | B1 | 9/2002 | Everitt et al. ............ 428/693 |
| 6,750,491 | B2 | 6/2004 | Sharma et al. ............ 257/295 |
| 6,819,530 | B2 | 11/2004 | Gill ......................... 360/314 |
| 6,865,109 | B2 | 3/2005 | Covington ................. 365/173 |
| 7,035,062 | B1* | 4/2006 | Mao et al. ................ 360/324.2 |
| 2003/0206384 | A1 | 11/2003 | Hoshiya et al. .......... 360/324.12 |
| 2003/0214763 | A1* | 11/2003 | Childress et al. ......... 360/324.2 |
| 2004/0057162 | A1 | 3/2004 | Gill ......................... 360/314 |
| 2004/0057164 | A1 | 3/2004 | Parker et al. ............ 360/324.11 |
| 2004/0109264 | A1 | 6/2004 | Gill ........................ 360/324.2 |
| 2004/0150901 | A1 | 8/2004 | Hiebert et al. ................ 360/1 |
| 2005/0045931 | A1 | 3/2005 | Min et al. ................. 257/295 |

FOREIGN PATENT DOCUMENTS

| JP | 2001230469 | 8/2001 |
| JP | 2003263708 | 9/2003 |

OTHER PUBLICATIONS

A.V. Pohm, J.M. Anderson, R.S. Beech, and J.M. Daughton; "Exchange Coupling and Edge Pinning in Vertical Head Sensors", IEEE Transactions on Magnetics, vol. 37, No. 4, Jul. 2001.
John M. Anderson, Arthur V. Pohm; "Ultra-low Hysteresis and Self-Biasing in GMR Sandwich Sendor Elements", IEEE Transactions on Magnetics, vol. 37, No. 4, Jul. 2001.

* cited by examiner

Primary Examiner—Jefferson Evans
(74) Attorney, Agent, or Firm—John L. Rogitz

(57) ABSTRACT

In a tunnel magnetoresistive (TMR) device, free sublayers are separated by an intermediate spacer layer that serves to ensure a uniform circumferential magnetization in the free stack, counterbalancing orange-peel coupling by antiferromagnetic exchange coupling. Thus, a CPP MR device may have a seed stack, a pinned stack on the seed stack, and a tunnel barrier on the pinned stack. A free stack can be on the tunnel barrier, and the free stack can include structure for promoting uniform circumferential magnetization in the free stack.

10 Claims, 5 Drawing Sheets

TUNNEL MR HEAD WITH CLOSED-EDGE LAMINATED FREE LAYER

FIELD OF THE INVENTION

The present invention generally relates to current-perpendicular-to-plane (CPP) magnetoresistive devices, such as tunnel magnetoresistive (TMR) devices for, e.g., disk drive read heads.

BACKGROUND OF THE INVENTION

In magnetic disk drives, data is written and read by magnetic transducers called "heads." The magnetic disks are rotated at high speeds, producing a thin layer of air called an air bearing surface (ABS). The read and write heads are supported over the rotating disk by the ABS, where they either induce or detect flux on the magnetic disk, thereby either writing or reading data. Layered thin film structures are typically used in the manufacture of read and write heads. In write heads, thin film structures provide high areal density, which is the amount of data stored per unit of disk surface area, and in read heads they provide high resolution.

The present invention is directed generally to devices that can be used, in some implementations, as heads for disk drives, and more particularly the present invention is directed to CPP devices such as tunnel magnetoresisitive (TMR) devices. A TMR device has at least two metallic ferromagnetic layers separated by a very thin nonmagnetic insulating tunnel barrier layer, wherein the tunneling current perpendicularly through the layers depends on the relative orientation of the magnetizations in the two ferromagnetic layers. The high magnetoresistance at room temperature and generally low magnetic switching fields of the TMR renders it effective for use in magnetic sensors, such as a read head in a magnetic recording disk drive, and nonvolatile memory elements or cells for magnetic random access memory (MRAM).

In a TMR device, one of the ferromagnetic layers has its magnetization fixed, such as by being pinned by exchange coupling with an adjacent antiferromagnetic layer, and the field of the other ferromagnetic layer is "free" to rotate in the presence of an applied magnetic field in the range of interest of the read head or memory cell.

Hard bias material typically is deposited on the sides of the sensor stack, between the stack and the outer magnetic shield, to stabilize the free layer. As understood herein, however, use of this hard bias material can reduce sensor sensitivity because the non-magnetic spacing between the hard bias and free layer necessitates an increase of the hard bias field for achieving proper free layer stability. The resulting magnetic field from the hard bias increases the effective anisotropy of the sensor, thus reducing its amplitude. Another artifact of side hard bias is the increase in the off-track reading sensitivity due the fact that side signals can enter the sensor through the hard bias material since the magnetic shield is relatively distanced from the sides of the sensor stack by the hard bias material.

The TMR sensor also must conform to size limitations. The resistance of the TMR sensor is inversely proportional to the area of the sensor, which is a product of the sensor track width and stripe height. Increase in the areal density of magnetic recording necessitates smaller sensor track width, which in TMR devices leads to prohibitively high sensor resistances. As recognized herein, however, if the stripe height can be increased while maintaining magnetic stability, narrow track width without increased sensor resistance can be achieved.

Accordingly, as critically recognized herein, it is desired to eliminate hard bias material on the sides of the sensor stack while nonetheless maintaining the stability of the free layers and while minimizing the resistance across the sensor to advantageously permit longer stripe heights (i.e., the distance from the air bearing surface of the sensor to the back edge of the sensor). While in-stack hard bias layers have been proposed, the present invention recognizes that such designs do not adequately ensure free layer stability. With these observations in mind, the invention herein is provided.

SUMMARY OF THE INVENTION

The present invention may be implemented in a CPP device such as a TMR device to provide one or more of the following advantages: a self-stabilizing free layer without the need of hard bias material on the sides of the sensor stack, with cancellation of edge charges; use of a relatively long stripe height without reducing stability and sensitivity to thereby promote low track width with acceptable sensor resistance; and a relatively soft free layer with a uniform effective $H_k$.

Accordingly, a tunnel magnetoresistive device has a pinned ferromagnetic layer with its magnetization direction substantially prevented from rotation in the presence of an applied magnetic field. The device also includes an insulating tunnel barrier layer on the pinned layer and a free ferromagnetic stack on the tunnel barrier layer with its magnetization direction substantially free to rotate in the presence of an applied magnetic field. The free ferromagnetic stack has an upper free sublayer, a lower free sublayer, and a spacer layer disposed between the free sublayers. The free sublayers are in contact with each other through opposed shoulders. The spacer layer does not extend completely to the ends of the lower free sublayer.

The shoulders have the same magnetic moment as that of the free sublayers. They may be made of the same material as the free sublayers, in which case the shoulders define a thickness that is the same as a thickness defined by each of the free sublayers.

The pinned and free stacks define opposed sides, and no hard bias material is disposed on sides of the stacks. Indeed, an insulator may be on the sides of the stack and a magnetic shield may cover the insulator in contact therewith without intervening hard bias material.

In another aspect, a CPP MR device includes a seed stack, a pinned stack on the seed stack, and a tunnel barrier on the pinned stack. A free stack is on the tunnel barrier. The free stack includes means for promoting uniform circumferential magnetization in the free stack.

In still another aspect, a method for making a CPP MR device includes forming a lower free sublayer on a tunnel barrier, and forming a spacer layer on the lower free sublayer. The method also includes forming an upper free sublayer on the spacer layer. A protective mask is then formed over the upper free sublayer, with unmasked portions of the upper free sublayer and spacer layer removed but substantially none of the lower free sublayer being removed. The method then includes forming, on the lower free sublayer next to ends of the upper free sublayer and spacer layer, shoulders having a magnetic moment matched to a magnetic moment of the lower and upper free sublayers.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
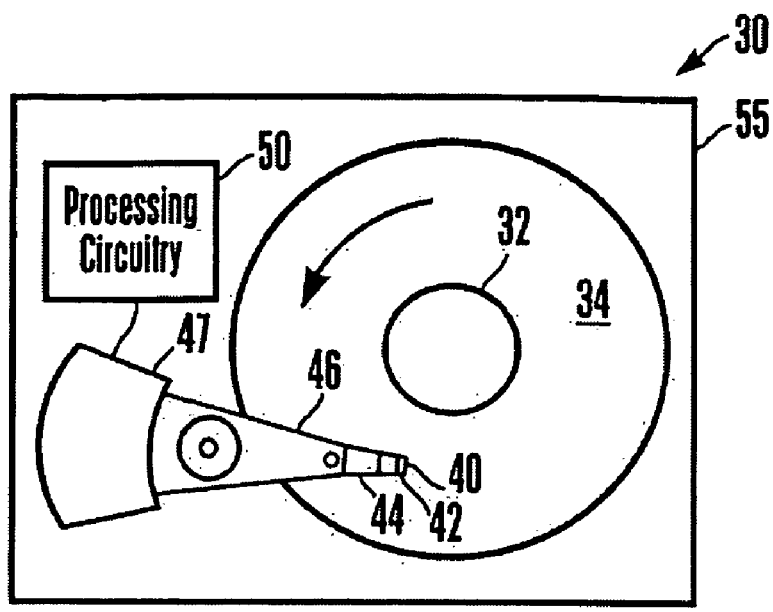
FIG. 1 is a schematic plan view of a hard disk drive, showing one non-limiting environment for the present invention.

Referring initially to FIG. 1, a magnetic disk drive 30 includes a spindle 32 that supports and rotates a magnetic disk 34. The spindle 32 is rotated by a spindle motor that is controlled by a motor controller which may be implemented in the electronics of the drive. A slider 42 has a combined read and write magnetic head 40 and is supported by a suspension 44 and actuator arm 46 that is rotatably positioned by an actuator 47. The head 40 may be a GMR or MR head or other magnetoresistive head. It is to be understood that a plurality of disks, sliders and suspensions may be employed. The suspension 44 and actuator arm 46 are moved by the actuator 47 to position the slider 42 so that the magnetic head 40 is in a transducing relationship with a surface of the magnetic disk 34. When the disk 34 is rotated by the spindle motor 36 the slider is supported on a thin cushion of air known as the air bearing that exists between the surface of the disk 34 and an air bearing surface (ABS) of the head. The magnetic head 40 may then be employed for writing information to multiple circular tracks on the surface of the disk 34, as well as for reading information therefrom. To this end, processing circuitry 50 exchanges signals, representing such information, with the head 40, provides spindle motor drive signals for rotating the magnetic disk 34, and provides control signals to the actuator for moving the slider to various tracks. The components described above may be mounted on a housing 55.

Figure 2:
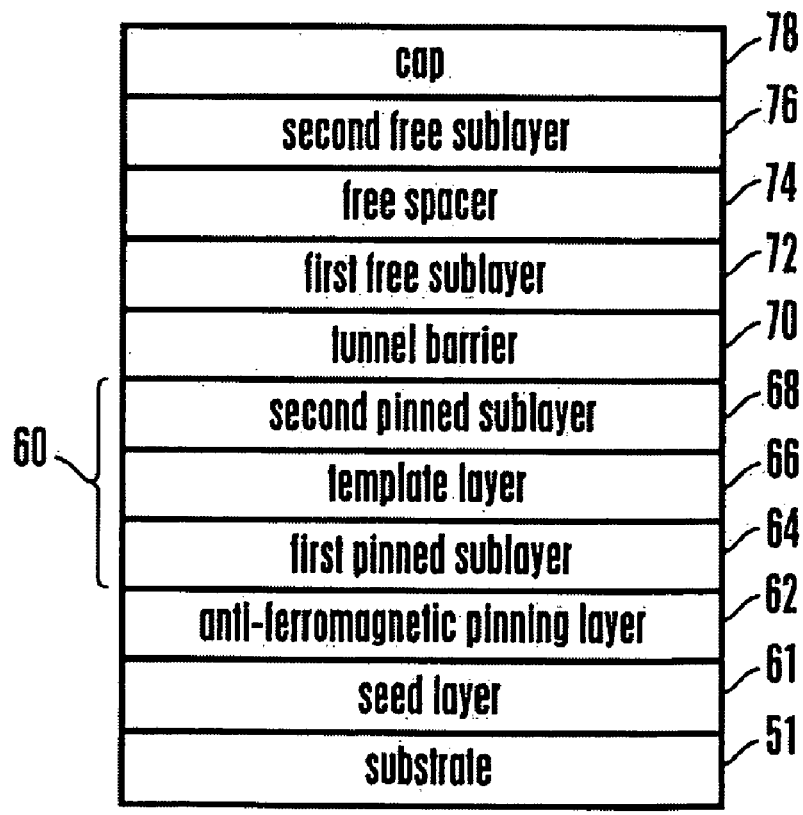
FIG. 2 is a cross-sectional view of an embodiment of a non-limiting TMR device made in accordance with the present invention, after the primary TMR stack has been established and before further processing.

Now referring to FIG. 2, the head 40 which is manufactured using the process of the present invention includes a TMR stack that may be formed on a substrate such as but not limited to a lower shield layer S1. In non-limiting implementations a pinned stack 60 may be formed on a seed layer 61 such as a bi-layer seed layer made of Ta/Ru or NiFeCr or Cu that is on the substrate and that in turn is covered by an antiferromagnetic sublayer 62 which may be made of IrMn, PtMn, IrMnCr, without limitation.

In the non-limiting embodiment shown, the pinned stack 60 can include a first pinned ferromagnetic sublayer 64 that may be made of, e.g., CoFe. The sublayer 64 is formed on the antiferromagnetic sublayer 62 as shown. Above the first pinned ferromagnetic sublayer 64 is a template sublayer 66 and on top of that a second pinned ferromagnetic sublayer 68, with the template sublayer 66 being made of, e.g., Ru or Cr or Ir and with the second pinned ferromagnetic sublayer 68 being made of CoFe or CoFeB, in non-limiting embodiments. The ferromagnetic sublayers 64, 68 are called "pinned" because their magnetization direction is prevented from rotation in the presence of applied magnetic fields in the desired range of interest for the TMR device. Without limitation, the sublayers 64, 66, 68 respectively may be, e.g., forty Angstroms thick/4.5 Angstroms thick/forty Angstroms thick.

Other CoFe and NiFe alloys may be used for the ferromagnetic sublayers and other antiferromagnetic materials may include NiMn and IrMn. The substrate may be a silicon wafer if, for instance, the device is a memory cell, and ordinarily would be the bottom electrically conductive lead located on either the alumina gap material or the magnetic shield material on the trailing surface of the head carrier if the device is a read head.

Formed on the pinned stack 60 is a tunnel barrier layer 70 that is made of an insulating tunnel barrier material. By way of non-limiting example, the barrier layer 70 may be five to fifteen Angstroms thick and may and may be made by depositing Aluminum on the pinned stack 60 and then oxidizing it to create an $Al_2O_3$ insulating tunnel barrier layer 70. While $Al_2O_3$ may be used, a wide range of other materials may be used, including MgO, AlN, aluminum oxynitride, oxides and nitrides of gallium and indium, and bilayers and trilayers of such materials.

A lower free ferromagnetic sublayer 72 is on the tunnel barrier 70 as shown. The lower free sublayer 72 may be made of, e.g., NiFe or CoFe. By "free" is meant that the magnetization direction of the free stack 72 is not pinned by exchange coupling, and is thus free to rotate in the presence of applied magnetic fields in the range of interest.

A free spacer layer 74 that may be Tantalum or Copper or Ruthenium or Tungsten can be provided on the lower free sublayer 72. On top of the spacer layer 74, an upper free sublayer 76 made of, e.g., NiFe or CoFe or CoFeB is deposited. A cap 78 made of, e.g., Tantalum is deposited on the upper free sublayer 76.

Figure 3:
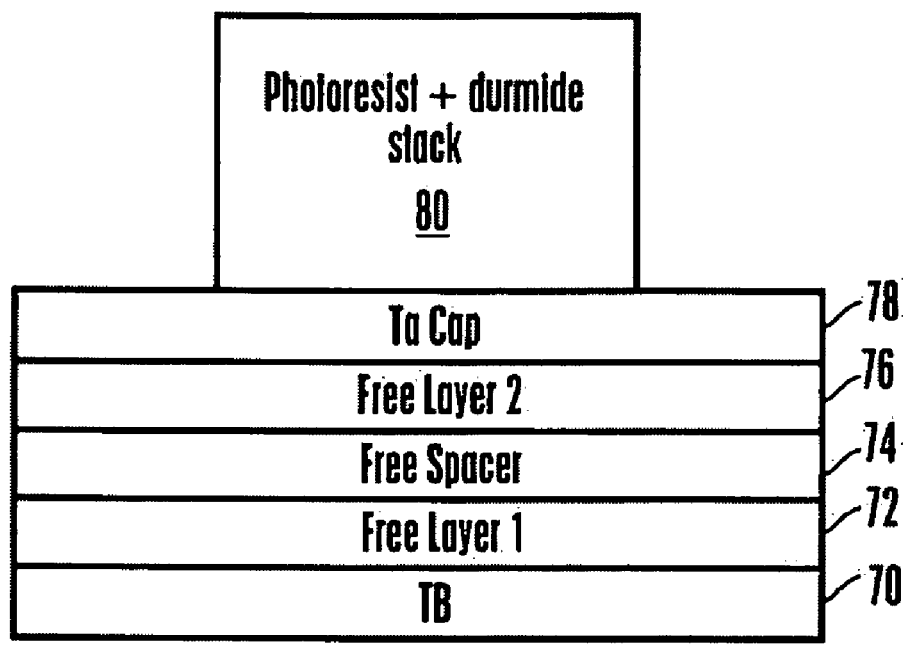
FIG. 3 shows the TMR device of FIG. 2, after depositing the photoresist mask, with portions of the device below the tunnel barrier omitted for clarity of exposition.
Figure 4:
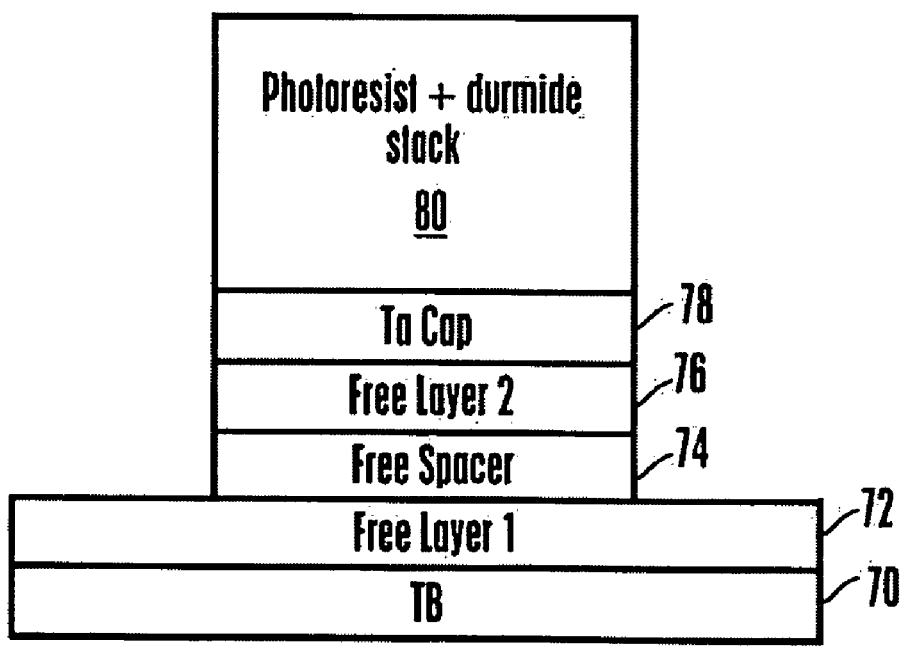
FIG. 4 shows the TMR device of FIG. 3 after reactive ion etch of certain portions, with portions of the device below the tunnel barrier omitted for clarity of exposition.

FIGS. 3-11 illustrate a non-limiting method for processing the stack shown in FIG. 2. First, as shown in FIG. 3 a stack or mask 80 of photoresist and duramide is deposited over the area of the TMR stack that will eventually form the head. Next, as shown in FIG. 4, an ion mill process may be used to remove areas of the TMR stack that are outside the mask 80, down to the free sublayer 72.

Figure 5:
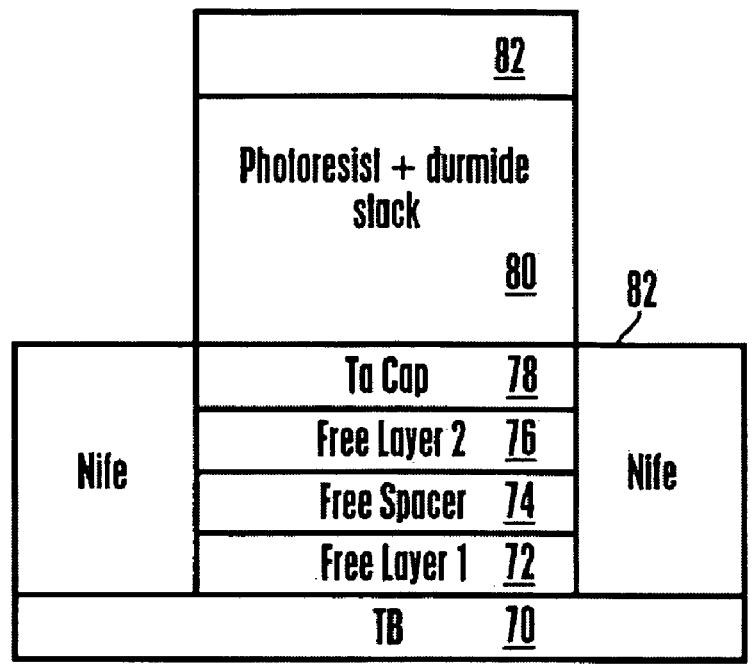
FIG. 5 shows the TMR device of FIG. 4 after ion beam deposition of the shoulders, with portions of the device below the tunnel barrier omitted for clarity of exposition.

Proceeding to FIG. 5, ion beam deposition may be used to deposit shoulders 82 onto the top of the unprotected portion of the free sublayer 72, on top of the mask 80, and onto the exposed sides of the protected areas of the TMR stack. The shoulders 82 may be made of NiFe or CoFe, and may be made of the same material as the free sublayer 72 or may be made of a different material, provided that the magnetic moments of the shoulders 82 and all free sublayers are matched. When the shoulders 82 are made of the same material as the free sublayers, the magnetic matching can be achieved by making the thickness of the shoulders the same as the thickness of each free sublayer. In the event that the shoulders are made of a different material than the free sublayer or sublayers, the magnetic matching can be achieved by appropriately establishing the thickness of the shoulders relative to the thickness of each free sublayer.

Figure 6:
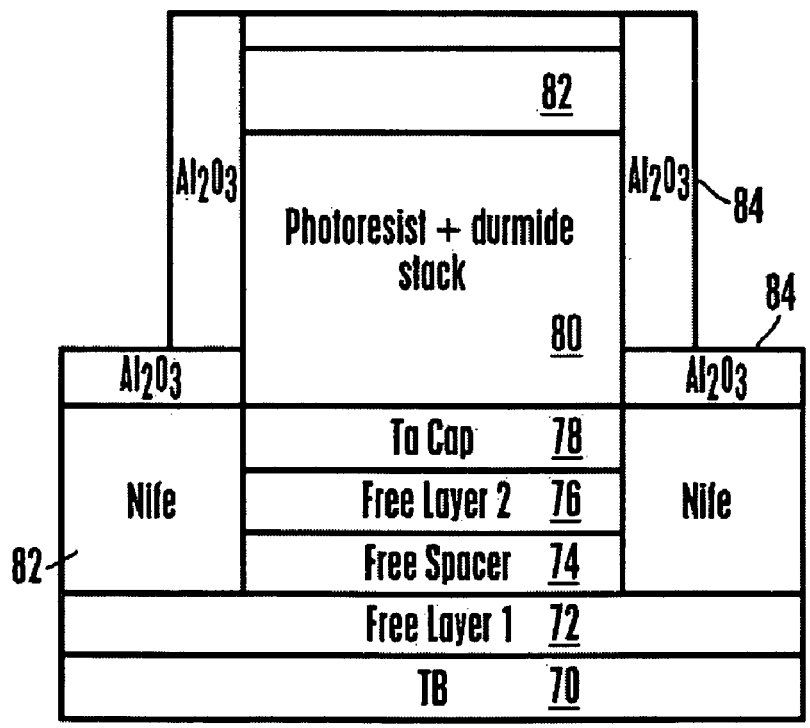
FIG. 6 shows the TMR device of FIG. 5 after deposition of the alumina, with portions of the device below the tunnel barrier omitted for clarity of exposition.

FIG. 6 shows that a layer 84 of alumina is next deposited over the shoulders 82, preferably at a thickness that is the same as the thickness of the free sublayer 72.

Figure 7:
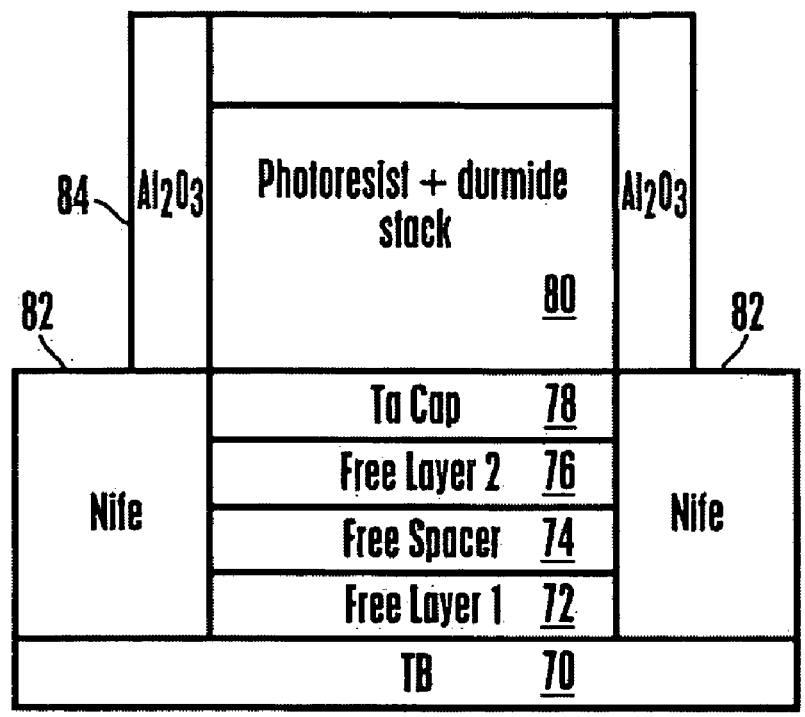
FIG. 7 shows the TMR device of FIG. 6 after etching away portions of the alumina, with portions of the device below the tunnel barrier omitted for clarity of exposition.
Figure 8:
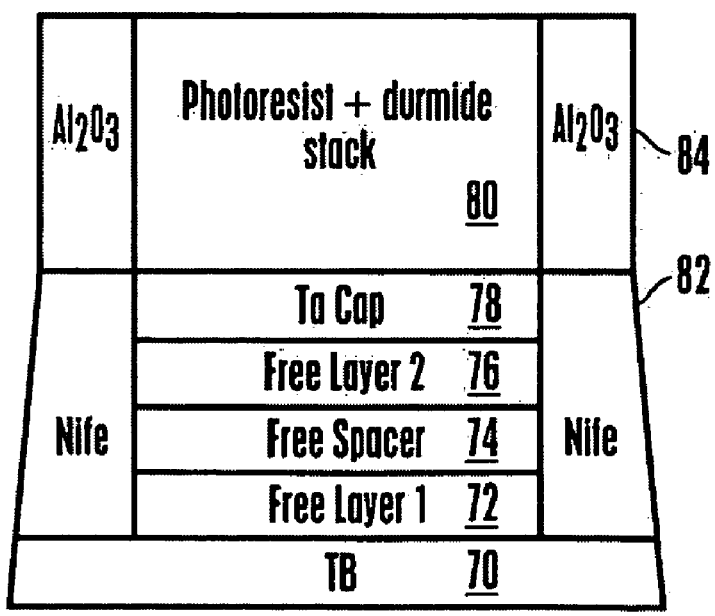
FIG. 8 shows the TMR device of FIG. 7 after milling away exposed portions of the stack, with portions of the device below the tunnel barrier omitted for clarity of exposition.

FIG. 7 shows that the portions of the layer 84 of alumina that overlie the mask 80 and the top surface of the shoulders 84 are removed by, e.g., reactive ion etch, leaving the alumina substantially only on the sides of the mask 80. All areas of the TMR stack that are not substantially under the mask 80 with alumina layer 84 on its sides are then removed by, e.g., a milling process, as shown in FIG. 8. It is to be understood that the TMR stack may assume a slightly trapezoidal shape in the section shown in FIG. 8, flaring slightly outwardly as shown from the free sublayer 72 down.

Figure 9:
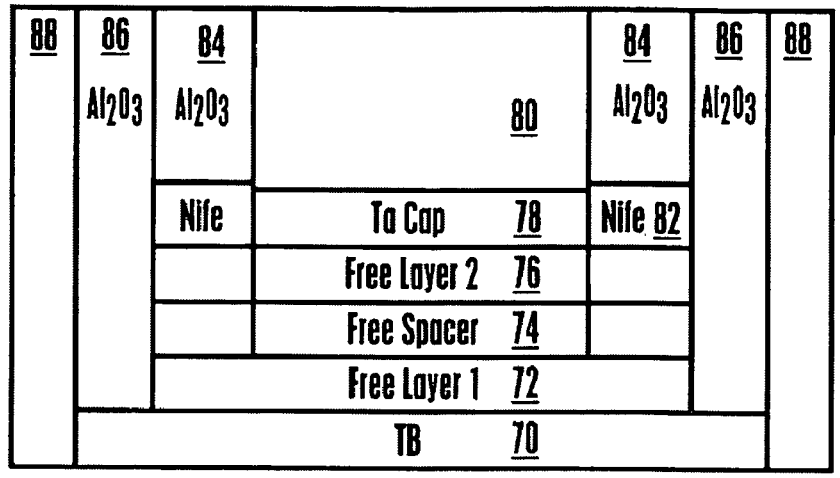
FIG. 9 shows the TMR device of FIG. 8 after depositing the side layers of alumina and the side shields, with portions of the device below the tunnel barrier omitted for clarity of exposition.

Turning now to FIG. 9, a second layer 86 of alumina is deposited onto the sides of the first layer 84 and the exposed sides of the TMR stack as shown. Also, the second layer 86 of alumina is surrounded by a shield 88 which may be made of, e.g., NiFe. Chemical-mechanical polishing (CMP) is then used to remove the mask 80, as illustrated in FIG. 10.

As also shown, substantially all portions of the alumina layers 84, 86 and shield 88 that are above the Tantalum cap are removed by the CMP, with the top of the cap lying just below the top surface of the shoulders 82, which is flush with the top surfaces of the remaining portions of the first and second alumina layers 84, 86 and shield 88 as shown.

Figure 10:
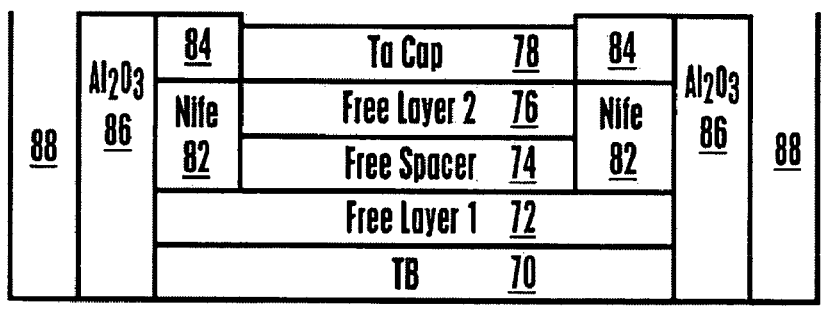
FIG. 10 shows the TMR device of FIG. 9 after removing the photoresist mask by chemical-mechanical polishing, with portions of the device below the tunnel barrier omitted for clarity of exposition.
Figure 11:
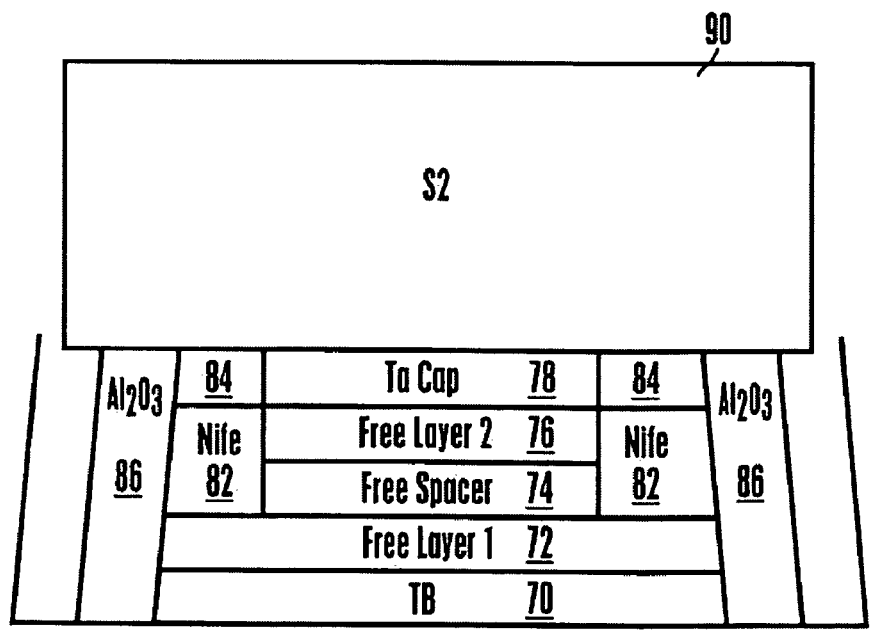
FIG. 11 shows the TMR device of FIG. 10 after depositing the S2 seed layer and side plating, with portions of the device below the tunnel barrier once again illustrated for completeness.

FIG. 11 shows that an S2 seed layer 90 is then plated or otherwise formed on the structure shown in FIG. 10.

In effect, stable circumferential magnetization is established in the combined structure that includes the shoulders 82 and the free sublayers, which are effectively stabilized. Improved sensor sensitivity is achieved owing to the omission of hard bias material on the sides of the sensor stack, with a relatively softer free stack being provided which has a uniform effective $H_k$. The anisotropy of the free stack sublayers is set in the longitudinal direction such that the combination of the shoulders and free stack sublayers counterbalances orange peel coupling.

While the particular TUNNEL MR HEAD WITH CLOSED-EDGE LAMINATED FREE LAYER as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". For instance, the invention can apply to CPP devices other than TMR devices, e.g., CPP GMR devices. It is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. Absent express definitions herein, claim terms are to be given all ordinary and accustomed meanings that are not irreconcilable with the present specification and file history.

What is claimed is:

1. A tunnel magnetoresistive (TMR) device comprising:
a pinned ferromagnetic layer having a magnetization substantially prevented from rotation in the presence of an applied magnetic field;
an insulating tunnel barrier layer on the pinned layer; and
a free ferromagnetic stack on the tunnel barrier layer and having at least one magnetization substantially free to rotate in the presence of an applied magnetic field, the free ferromagnetic stack having an upper free sublayer, a lower free sublayer, and a spacer layer disposed between the free sublayers, the free sublayers being in contact with each other through opposed shoulders, the spacer layer not extending completely to the ends of the lower free sublayer, wherein the shoulders are made of the same material as the free sublayers, at least one shoulder defining a thickness that is the same as a thickness defined by each of the free sublayers, the at least one shoulder defining a single constant thickness and no other thicknesses and the free sublayers likewise defining respective single constant thicknesses and no other thicknesses, the at least one shoulder not being interposed between any free sublayer and the spacer layer.

2. The device of claim 1, wherein the shoulders have the same magnetic moment as that of the free sublayers.

3. The TMR device of claim 1, wherein the pinned and free stacks define opposed sides, and no hard bias material is disposed on sides of the stacks.

4. The TMR device of claim 3, comprising an insulator on the sides of the stack and a magnetic shield covering the insulator in contact therewith.

5. A CPP MR device, comprising:
a seed stack;
a pinned stack on the seed stack;
a tunnel barrier on the pinned stack; and
a free stack on the tunnel barrier, the free stack including means for promoting uniform circumferential magnetization in the free stack, comprising an insulator on the sides of the free stack and a magnetic shield covering the insulator in contact therewith.

6. The device of claim 5, wherein the means for promoting includes a spacer extending only part way across the free stack between two free sublayers of the free stack, the lower free sublayer extending completely across the free stack.

7. The CPP MR device of claim 5, wherein the device is a TMR device.

8. The device of claim 5, wherein the shoulders have the same magnetic moment as that of the free sublayers.

9. The device of claim 8, wherein the shoulders are made of the same material as the free sublayer, the shoulders defining a thickness that is the same as a thickness defined by a free sublayer.

10. The device of claim 5, wherein the pinned and free stacks define opposed sides, and no hard bias material is disposed on sides of the stacks.

* * * * *